United States Patent [19]

Peterson

[11] Patent Number: 5,121,072
[45] Date of Patent: Jun. 9, 1992

[54] DIGITAL DEMODULATOR FOR AMPLITUDE OR ANGLE MODULATION USING TRUNCATED NONLINEAR POWER SERIES APPROXIMATIONS

[75] Inventor: Maurice W. Peterson, Swisher, Iowa

[73] Assignee: Rockwell International Corporation, Seal Beach, Calif.

[21] Appl. No.: 618,764

[22] Filed: Nov. 27, 1990

[51] Int. Cl.$^5$ .......................... H03D 1/00; H03D 3/00
[52] U.S. Cl. ................................. 329/317; 329/341; 329/345; 329/347; 375/80; 455/142; 455/214; 455/337
[58] Field of Search ............... 329/316, 317, 341, 343, 329/345, 347; 375/80, 81, 82, 94; 455/214, 337, 142, 144

[56] References Cited

U.S. PATENT DOCUMENTS 4,794,341 12/1988 Barton et al. ..................... 375/94 X

*Primary Examiner*—Siegfried H. Grimm
*Attorney, Agent, or Firm*—John J. Horn; M. Lee Murrah; H. Fredrick Hamann

[57] ABSTRACT

A digital demodulator for demodulating baseband signals in a radio receiver. The demodulator includes a digital signal processing module for forming a mathematical series adapted for generating demodulation functions. The selection of coefficients for this series is controlled to provide specific demodulation functions as required for the demodulation of different kinds of signals such as amplitude modulated or angle modulated signals using one computational block or element. When demodulating amplitude modulated signals, the coefficients used in the mathematical series provide an approximation to the square root function. When demodulating phase or frequency modulated signals, the coefficients used provide an approximation to the arctangent function.

12 Claims, 2 Drawing Sheets

DIGITAL DEMODULATOR FOR AMPLITUDE OR ANGLE MODULATION USING TRUNCATED NONLINEAR POWER SERIES APPROXIMATIONS

BACKGROUND OF THE INVENTION

This invention relates generally to demodulators and, more particularly, to digital demodulators for both amplitude and angle modulated signals which operate on baseband signal components which are in quadrature.

While demodulation schemes are known and function successfully they suffer from various disadvantages. Many require calibration, adjustment and compensation for ageing when used with digitally sampled data signals. Some employ the use of extensive look up tables to derive the informational characteristic carried by the communications signal desired to be demodulated and have substantial memory requirements. Almost all of the conventional demodulation schemes lack adaptability to benefit from recent increases in computational capacity and hardware precision.

SUMMARY OF THE INVENTION

It is therefore an object of the present invention to provide an improved digital demodulator and method of demodulating digital quadrature I and Q components of baseband signals in a radio receiver.

It is another object of the present invention to provide a digital demodulator for computing an informational characteristic of baseband quadrature components by using a mathematical series approximation composed of a preselected number of terms of increasing refinement in approximation.

It is a further object of the present invention to provide a digital demodulator for demodulating the digitized in-phase component sample and the quadrature component sample of a baseband signal in a direct conversion radio receiver comprising means responsive to the I and Q samples to compute one of a plurality of informational characteristics by means of a mathematical series approximation having different coefficients depending upon the type of modulation present.

The digital demodulator of the present invention is preferably implemented with a properly programmed digital signal processor. In one mode of operation (AM mode) the informational characteristic of the input signal for which the approximation is produced is the square root of the sum of squares of signal magnitude. In another mode of operation (FM/PM mode) the informational characteristic is the tangent of the phase angle. A mode selection switch is preferably provided for selection of an amplitude mode or an angle mode of operation. The means for computing the informational characteristic is responsive to the mode selection switch for computing the square of the magnitude of the input signal when the AM mode has been selected and computing the tangent of the phase angle of the input signal when the angle mode is selected. In both modes of operation, the approximation is then obtained by means of the same truncated power series but with different coefficients for calculating the square root of the square of signal magnitude or the arctangent of the tangent of the phase angle.

BRIEF DESCRIPTION OF THE DRAWINGS

The foregoing objects and advantageous features of the invention will be explained in greater detail and others will be made apparent from the detailed description of the preferred embodiment of the present invention which is given with reference to the figures of the drawing, in which.

DESCRIPTION OF THE PREFERRED EMBODIMENT

Figure 1:
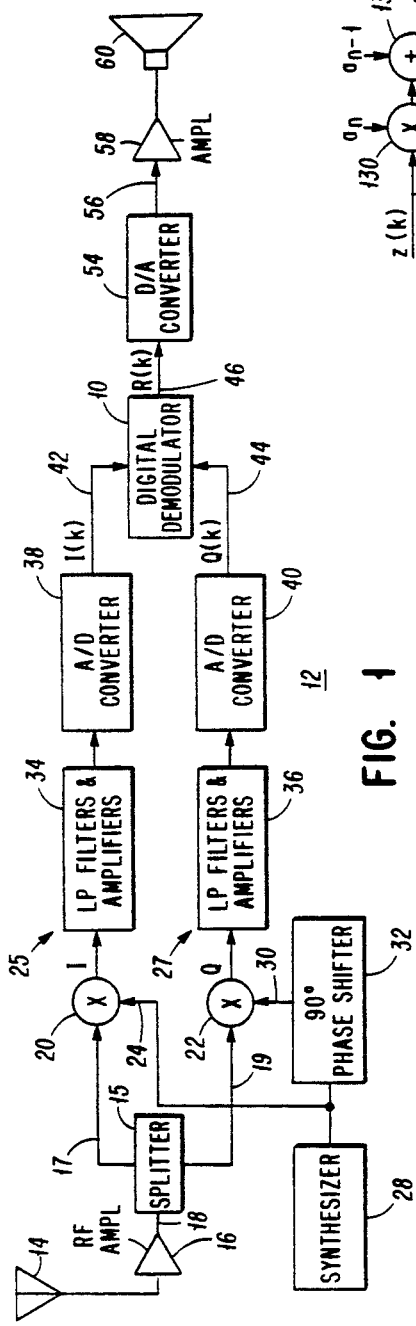
FIG. 1 is an overall block diagram of a radio receiver in which the digital demodulator of the present invention may be employed.

Referring now to FIG. 1, a direct conversion radio receiver 12 is shown in which a digital demodulator 10 in accordance with the present invention is utilized. Communications signals received by the antenna 14 are supplied to a radio frequency ("RF") preamplifier 16 which provides a limited amount of RF gain. Output from the preamplifier 16 is supplied along line 18 to the splitter 15 where it is split into equal power and in-phase RF components which are supplied to the mixers 20 and 22 on lines 17 and 19. The mixers 20 and 22 are also supplied with injection signals o the lines 24 and 30. These injection signals are generated by the synthesizer 28 so as to be on frequency with the communications signal intended to be received and processed by the radio receiver 12. The injection signal provided to the mixer 20 is supplied directly from the synthesizer 28 while the injection signal provided to the mixer 22 is supplied by way of a phase shifter 32 which adjusts the phase of the injection signal supplied to mixer 22 so that it is in quadrature (i.e. 90° out-of-phase) with the injection signal supplied to mixer 20.

The mixers 20 and 22 produce I and Q baseband signal components which are separately processed on the I and Q signal channels 25 and 27. More specifically, the I and Q baseband components are separately filtered and amplified in one or more LP filters and one or more amplifier stages 34 and 36 which provide the primary selectivity and gain for the receiver 12. The outputs of the filter and amplifier stages 34 and 36 are furnished to the analog-to-digital ("A/D") converters 38 and 40 which include suitable sample and hold circuitry driven with a common sampling clock signal $F_s$. The A/D converters 38 and 40 convert the I and Q baseband components from analog to digital format.

The resulting digitized baseband components I(k) and Q(k) (discrete time functions) which are output from the A/D converters 38 and 40 are supplied along the lines 42 and 44 to the digital demodulator 10. The digital demodulator 10 includes a digital signal processor and associated hardware for demodulating the communications signal received by the radio receiver 12 and detecting the informational characteristic of the communications signal. The output R(k) of the digital demodulator 10 is supplied along line 46 to the digital-to-analog ("D/A") converter 54 where it si converted from digital to analog format. The analog output of the digital-toanalog converter 54 is provided on line 56 to an audio amplifier 58 which drives a loud speaker 60.

Figure 2:
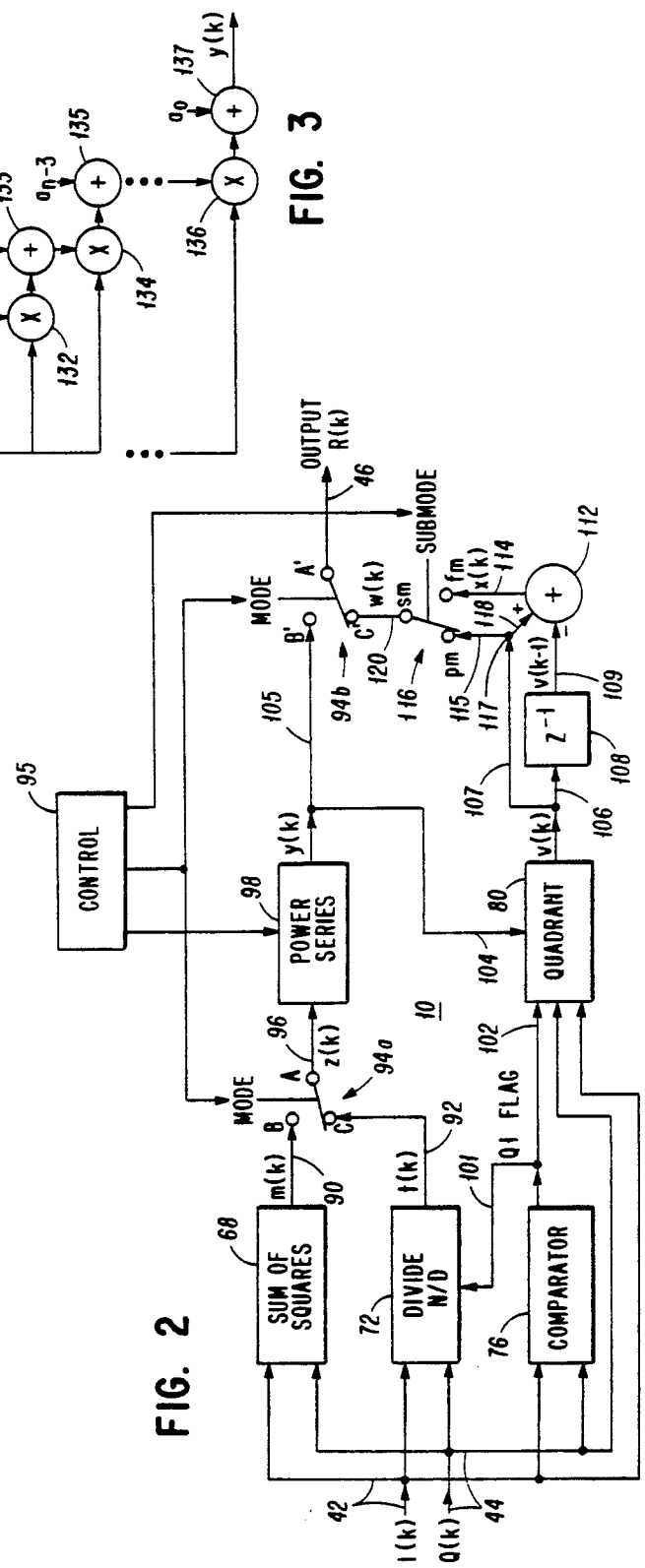
FIG. 2 is a functional block diagram of the digital demodulator shown in FIG. 1.
Figure 4:
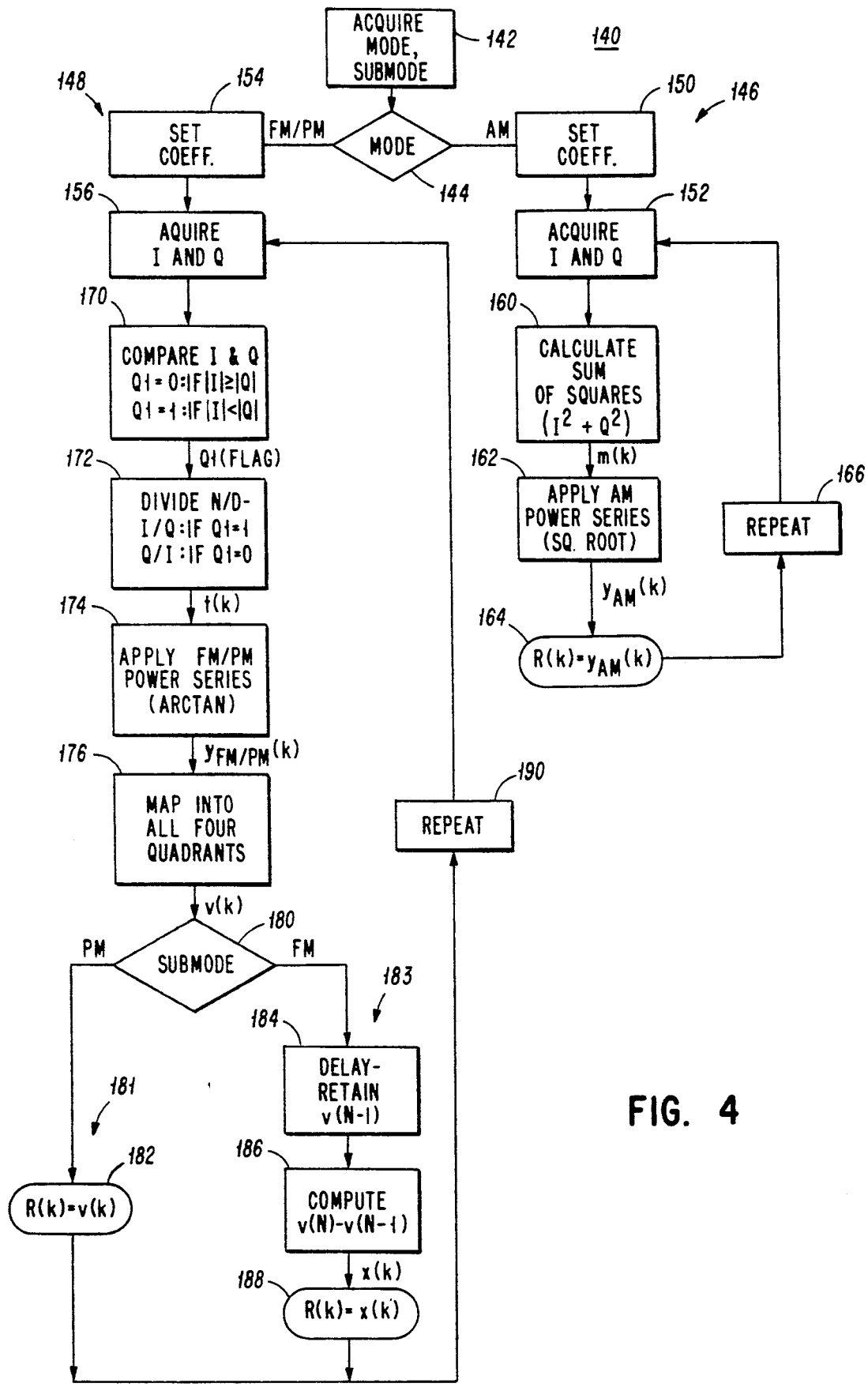
FIG. 4 is a flowchart of a signal processing algorithm corresponding to the actual operation of digital demodulator shown in FIG. 2.

Referring now to FIG. 2, the digital demodulator 10 operates in accordance with a signal processing algorithm which uses a power series network 98 for calculating key mathematical functions. It should be noted that FIG. 2 is provided primarily for explanatory purposes and that FIG. 4 provides a more accurate representation of the operation of demodulator of the present invention. Corresponding samples of the digitized baseband components I(k) and Q(k) output from the A/D converters 38 and 40 are supplied on lines 42 and 40 for use by the networks 68, 72, 76 and 80. In the sum of squares network 68, I and Q samples are squared in value and added together to generate the digital function m(k). In the divide N/D network routine 72, the I and Q samples are divided by one another to produce the digital function t(k). The comparator network 76 generates a Q1 flag which is a function of the comparative magnitudes of the I and Q components and more specifically whether $Q(k) \leq I(k)$ or $Q(k) > I(k)$.

The Q1 flag is supplied to the divide N/D network 72 on line 101 and controls the division process so that the quotient "N/D" is always <1 whereby the calculation processes involved are simplified. The outputs m(k) and t(k) of the sum of squares and the divide N/D networks 68 and 72 are provided on lines 90 and 92 to the mode switch 94a. The mode switch 94a, as well as the mode switch 94b, are responsive to operator control for selecting either AM (amplitude) or FM/PM (angle) demodulation modes. If AM communications signals are to be demodulated, then the switches 94a and 94b are set so that the input poles B and B' are connected to the output poles A and A'. If FM or PM communications signals are to be demodulated, then the mode switches 94a and 94b are set so that the input poles C and C' are connected to the output poles A and A'. The mode switch 94a directs either the output m(k) from the sum of squares network 68 or the output t(k) from the divide N/D network 72 along line 96 to the power series network 98 as input z(k).

Depending on the mode selected, either m(k) or t(k) is passed on to the power series network 98 as shown in equation (1) below:

$$z(k) = [mode * m(k)] + [mode' * t(k)] \quad (1)$$

where:
mode = 0: for angle modulation
mode = 1: for amplitude modulation

No matter which type of modulation has been selected, a truncated power series of the form shown in equation (2) below is used with different coefficients depending on the mode:

$$y(k) = a_0 + a_1 z + ... + a_n z^n. \quad (2)$$

The power series network 98 forms a sum of terms of increasing powers wherein the coefficients of the terms are regulated to correspond to desired functions. The required coefficients may be loaded or controlled from the control network 95 in coordination with the selection of the demodulation mode. Coefficients corresponding to the square root function are loaded when the system 10 is in the AM mode for demodulating AM signals and coefficients corresponding to the arctangent function are loaded when the system 10 is in the FM/PM mode for demodulating either FM or PM signals. The use of the power series network 98 for implementing these functions provides flexibility and efficiency to the system 10 in determining the informational characteristic of the communications signal input to the system.

The output y(k) of the power series network 98 is supplied on lines 105 and 104 to mode switch 94b and quadrant network 80. When the system 10 is in the AM mode, the output y(k) of the power series network 98 is passed by the mode switch 94b from poles B' to A' to the line 46 as the final output R(k) of the system 10. When the system 10 is in the FM/PM mode, the quadrant network 80 employs its I(k) and Q(k) inputs and the Q1 flag to determine the quadrant in which the phasor represented by the baseband components I and Q signals I(k) and Q(k) is resident at any given time. The quadrant network 80 then maps the modified arctangent output y(k) of the the power series network 98 (which is limited to + or − τ/4 due to the restrictions imposed on the operation of the divide N/D network 72) into all four quadrants in accordance with the values of its I(k) and Q(k) inputs. The output v(k) of the quadrant network 80 is supplied along lines 107 and 106 to node 117 and the delay network 108. The output v(k) of the quadrant network 80 is further supplied from the node 117 on line 115 to the PM pole of the sub-mode switch 116 and along line 118 to the summing network 112.

The delay network 108 is operative for retaining a "previous" output v(N−1) (N representing a specific value of k) of the quadrant network 80 and presenting this output to the summing network 112 at the same time that the current output v(N) of the quadrant network 80 is presented to the same network 112. The summing network 112 subtracts the previous output v(N−1) from the current output v(N) of the quadrant network 80 whereby an output x(k) representing differences in v(k) with time (and approximating a derivative of v(k)) is formed which is supplied along the line 114 to the FM pole of the sub-mode switch 116.

The sub-mode switch 116 is responsive to operator control via the control network 95 for selecting either FM or PM demodulation modes. If FM communications signals are to be demodulated, then the mode switch 116 is set so that the input pole FM is connected to the output pole SM. If PM communications signals are to be demodulated, then the mode switch 116 is set so that the PM pole is connected to the output pole SM. The sub-mode switch 116 directs either the current output v(k) of the quadrant network 80 or the output x(k) of the summing network 112 along the line 120 to the pole C' of the mode switch 94b. Depending on the mode selected either v(k) or x(k) is passed to the mode switch 94b as the output w(k) of the sub-mode switch 116 as shown in equation (3) below:

$$w(k) = [\text{sub-mode} * x(k)] + [\text{sub-mode}' * v(k)] \quad (3)$$

where:
sub-mode = 0: for phase modulation
sub-mode = 1: for frequency modulation When the system 10 is in the FM/PM demodulation mode the output w(k) of the sub-mode switch 116 is passed by the mode switch 94b from pole C' to pole A. along the line 46 as the final output R(k) of the system 10. The output R(k) is determined by the operational mode as shown in equation (4) below:

$$R(k) = [mode * y(k)] + [mode' * w(k)] \quad (4)$$

Referring now to FIG. 4, the Flow Chart 140 reflects the operation of a digital signal processing software module in accordance with the principles of the present invention. In step 142, mode and sub-mode data is acquired by the system 10. Accordingly, in step 144, either an AM mode routine 146 or an FM/PM mode routine 148 is entered depending on the demodulation mode selected by the operator.

In the event that the AM mode routine 146 is entered, the coefficients for the power series used in step 162 are set in step 150 to correspond to operation in the AM mode (i.e. square root function). Regular processing is then begun in step 152 as data is acquired in the form of separate samples of the baseband components I(k) and Q(k) from the I and Q channels 25 and 27 provided by the A/D converters 38 and 40 to the software module of the demodulator system 10 for processing. Pursuant to step 160, the values of the samples are squared and added to form the function m(k) as shown in equation (5) below.

$$m(k) = I(k)^2 + Q(k)^2 \qquad (5)$$

The AM power series is then applied to the current value of the function m(k) pursuant to step 162 whereby the square root function $y_{AM}(k)$ is calculated. In the AM mode, the function $y_{AM}(k)$ represents the final output R(k) of the demodulator system 10 shown in step 164 and corresponds to the informational characteristic of the communications signal to be demodulated. In accordance with step 166, steps 152, 160, 162 and 164 are then repeated with new samples of the baseband components I(k) and Q(k).

In event that the FM/PM mode routine 148 is entered, the coefficients for the power series used in step 174 are set in step 154 to correspond to operation in the FM/PM mode (i.e. arctangent function). Regular processing is then begun in step 156 as data is acquired in the form of separate samples of the baseband components I(k) and Q(k) provided by the A/D converters 38 and 40 to the software module of the demodulator system 10 for processing. Pursuant to step 170, the values of the samples are compared and the flag Q1 is set either to zero or 1 as shown in equations (6) below:

$$Q1 = 0 : for |Q/I| <= 1 \qquad (6)$$

$$Q1 = 1 : for |Q/I| > 1$$

If the absolute value of the I sample is greater than or equal to the absolute value of the Q sample, then the Q1 flag is set to 0. If the absolute value of the Q sample is greater than the absolute value of the I sample then the Q1 flag is set to 1. Pursuant to step 172, the I and Q samples are divided by one another depending on the value of the Q1 flag as shown in equation (7) below.

$$t(k) = [Q1 * I/Q] + [Q1' * Q/I]. \qquad (7)$$

If the Q1 flag equals 1, then the value of the I sample is divided by the value of the Q sample. If the Q1 flag equals zero, then the value of the Q sample is divided by the value of the I sample. The FM/PM power series is then applied to the current value of the function t(k) pursuant to step 174 whereby the modified arctangent function $y_{FM/PM}(k)$ is calculated. However, on account of the restrictions imposed on the previous operations in step 172, the function $y_{FM/PM}(k)$ represents values ranging only between plus or minus pi/4 and consequently is not a true phasor function. In step 176, the Q1 flag and the original samples of the baseband components I(k) and Q(k) are used to determine the proper quadrant in which the function $y_{FM/PM}(k)$ should be resident and maps the function into the appropriate quadrant to form a proper phasor function v(k) as shown in equation (8) below:

$$v(k) = [Q1 * \{qneg*(-pi/2-y(k)) + qneg'*(pi/2-y(k))\}] + [Q1'* (ineg*(pi+y(k)) + ineg'*y(k))\}]$$

where ,
 qneg = 1: for Q < 0
 qneg = 0: for Q > = 0
 ineg = 1; for I < 0
 ineg = 0: for I > = 0
 = 3.141...(one semicircle).

In step 180 either the PM mode routine or the FM mode routine is entered depending on the submode data acquired in step 142 and the mode selected by the operator. In the event that the PM mode has been selected, the final output R(k) is set equal to the function v(k) without further processing. In the event that the FM mode has been selected, the value v(N−1) of the output v(k) of step 176 is stored in memory. In step 186 the current value v(N) is differenced with the previous value v(N−1) retained in step 184 in order to calculate the function w(k) (which approximates a derivative of the function v(k)) as shown in equation (9) below:

$$x(k) = \Delta v(k) = v(N) - v(N-1) \qquad (9)$$

where:
 N = a specific value of k

Pursuant to step 188 the final output R(k) is set equal to the value of the function x(k). The steps 182 and 188 represent final steps in the processing routine 148 whereby a final output R(k) corresponding to the demodulated information is provided. However, in accordance with step 190, steps 156, 170, 172, 174, 176, 180, 182, 184, 186 and 188 are then repeated with new samples of the baseband components I(k) and Q(k).

Figure 3:
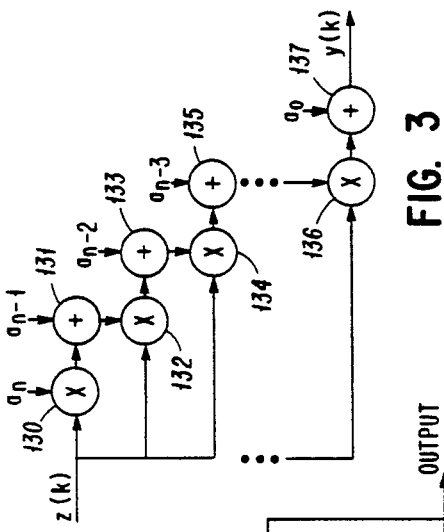
FIG. 3 is a computational diagram of a preferred power series as used in the digital demodulator shown in FIG. 2.

Referring now to FIG. 3, a method for implementing a power series of the type comprising network 98 which is applied to samples of the function z(k) is diagrammatically illustrated. Specific solution values of the power series corresponding to specific samples of the function z(k) are cumulatively built up by repetitively adding and multiplying terms by z(k). Steps 130, 132, 134 and 136 represent multiplication operations with a specific sample of z(k) while the steps 131, 133, 135 and 137 represent addition operations wherein new coefficients are introduced. The method illustrated in FIG. 3 results in a power series equation of the form of equation (10) below:

$$Y(k) = a_0 + (a_1(a_2(...(a_n-3 + (a_n-2 + (a_n-1 + a_n*Z)Z)...)*Z*Z)*Z \qquad (10)$$

where: Z = Z(k)

TABLE I

|  | SQ/RT | ARCTAN |
|---|---|---|
| $a_0$ - | 0.196350 | 0.000030 |
| $a_1$ - | 1.5015864 | 0.997711 |
| $a_2$ - | −1.358154 | 0.026641 |
| $a_3$ - | 0.934326 | −0.457567 |
| $a_4$ - | −0.274292 | 0.269859 |

TABLE I-continued

| | SQ/RT | ARCTAN |
|---|---|---|
| $a_5$ - | 0.000000 | 0.051268 |
| | −0.024% error | −.006% error |

Table I gives values for the coefficients of a truncated power series of the type shown in equation (11) which would allow the power series to approximate square root and arctangent functions to the degree of precision shown. The ability of the power series network 98 to shift between different sets of coefficients representing different functions thereby allowing for the demodulation of communication signals modulated in accordance with different techniques is a key feature of the present invention providing substantial flexibility to the demodulator 10 and the radio receiver 12.

I claim:

1. In a digital demodulator adapted for demodulating baseband signals in a radio receiver, the improvement comprising:
   means for selecting coefficients for a truncated mathematical power series corresponding to a specific demodulation function; and
   means for detecting the informational characteristic of said baseband signals by calculating said mathematical series based on values of said signals and said coefficients.

2. The improvement of claim 1, wherein said power series includes coefficients selected to generate a square root function useful in demodulating AM signals.

3. The improvement of claim 1 wherein said power series includes coefficients selected to generate an arctangent function useful in demodulating FM/PM signals.

4. A process for demodulating baseband signals in a direct conversion receiver, comprising the steps of:
   selecting coefficients for a truncated mathematical power series adapted for generating a specific demodulation function; and
   detecting the informational characteristic of said baseband signals by calculating said mathematical series based on the values of said signals and said coefficients.

5. The process of claim 4, wherein said demodulation function comprises a square root function.

6. The process of claim 4 wherein said demodulation function comprises an arctangent function.

7. A digital demodulator adapted for demodulating baseband signals in a direct conversion radio receiver, comprising:
   control means for selecting coefficients for a truncated mathematical power series adapted for generating a specific demodulation function;
   means for preprocessing said baseband signals to generate preprocessed signals adapted for input to said demodulation function; and
   means for detecting the informational characteristic of said baseband signals by calculating said mathematical series based on values of said preprocessed signals and said coefficients.

8. The demodulator of claim 7, wherein said means for preprocessing is operative for forming ratios of said signals.

9. The demodulator of claim 7 wherein said means for preprocessing is operative for forming a sum of squares of said signals.

10. In a digital demodulator adapted for demodulating baseband signals representing an angle or amplitude modulated carrier in a radio receiver, the improvement comprising:
    means for sampling the modulated signal and digitizing the samples to provide a digital representation of the modulated signal and
    means for selecting coefficients based on the operational mode of the demodulator for a truncated mathematical power series comprising a polynomial with a specific number of terms where at least one term has the input variable raised to a power >1 and said series is used to approximate a specific demodulation function.

11. The demodulator of claim 10, wherein said demodulation function comprises a square root function for amplitude demodulation.

12. The demodulator demodulation of claim 10, wherein said demodulation function comprises an arctangent function for angle demodulation.

* * * * *